(12) United States Patent
Carey et al.

(10) Patent No.: US 7,580,229 B2
(45) Date of Patent: Aug. 25, 2009

(54) CURRENT-PERPENDICULAR-TO-THE-PLANE (CPP) MAGNETORESISTIVE SENSOR WITH ANTIPARALLEL-FREE LAYER STRUCTURE AND LOW CURRENT-INDUCED NOISE

(75) Inventors: Matthew J. Carey, San Jose, CA (US); Jeffrey R. Childress, San Jose, CA (US); Stefan Maat, San Jose, CA (US); Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 587 days.

(21) Appl. No.: 11/380,625

(22) Filed: Apr. 27, 2006

(65) Prior Publication Data
US 2007/0253119 A1 Nov. 1, 2007

(51) Int. Cl.
*G11B 5/39* (2006.01)
(52) U.S. Cl. .................................. 360/324.12
(58) Field of Classification Search .... 360/324.1–324.2
See application file for complete search history.

(56) References Cited

U.S. PATENT DOCUMENTS

| | | | |
|---|---|---|---|
| 2,172,430 A | 9/1939 | Barrell | |
| 2,554,034 A | 5/1951 | Koester et al. | |
| 3,094,149 A | 6/1963 | Keily | |
| 3,325,909 A | 6/1967 | Clark | |
| 4,093,512 A | 6/1978 | Fleischer | |
| 4,182,381 A | 1/1980 | Gisbourne | |
| 4,244,543 A | 1/1981 | Ericson | |

(Continued)

FOREIGN PATENT DOCUMENTS

DE  454 092  12/1927

(Continued)

OTHER PUBLICATIONS

Li et al., "Reduction of AMR Effect in Giant Magnetoresistance Spin Valve Structures", IEEE Transactions on Magnetics, vol. 37, No. 4, Jul. 2001, pp. 1733-1735.

(Continued)

*Primary Examiner*—A. J. Heinz
(74) *Attorney, Agent, or Firm*—Thomas R. Berthold (57) ABSTRACT

A current-perpendicular-to-the-plane (CPP) magnetoresistive sensor has an antiparallel free (APF) structure as the free layer and a specific direction for the applied bias or sense current. The (APF) structure has a first free ferromagnetic (FL1), a second free ferromagnetic layer (FL2), and an antiparallel (AP) coupling (APC) layer that couples FL1 and FL2 together antiferromagnetically with the result that FL1 and FL2 have substantially antiparallel magnetization directions and rotate together in the presence of a magnetic field. The thicknesses of FL1 and FL2 are chosen to obtain the desired net free layer magnetic moment/area for the sensor, and the thickness of FL1 is preferably chosen to be greater than the spin-diffusion length of the electrons in the FL1 material to maximize the bulk spin-dependent scattering of electrons and thus maximize the sensor signal. The CPP sensor operates specifically with the conventional sense current (opposite the electron current) directed from the pinned ferromagnetic layer to the APF structure, which results in suppression of current-induced noise.

21 Claims, 6 Drawing Sheets

U.S. PATENT DOCUMENTS

| | | |
|---|---|---|
| 4,289,173 A | 9/1981 | Miller |
| 4,290,209 A | 9/1981 | Buchanan et al. |
| 4,414,263 A | 11/1983 | Miller et al. |
| 4,438,788 A | 3/1984 | Harwood |
| 4,452,284 A | 6/1984 | Eckstein et al. |
| 4,453,573 A | 6/1984 | Thompson |
| 4,501,303 A | 2/1985 | Osterberg |
| 4,515,853 A | 5/1985 | Borel |
| 4,529,013 A | 7/1985 | Miller |
| 4,564,052 A | 1/1986 | Borel |
| 4,564,551 A | 1/1986 | Best |
| 4,592,395 A | 6/1986 | Borel |
| 4,592,396 A | 6/1986 | Borel et al. |
| 4,605,585 A | 8/1986 | Johansson |
| 4,611,639 A | 9/1986 | Bugge |
| 4,621,663 A | 11/1986 | Malmendier |
| 4,633,596 A | 1/1987 | Josef |
| 4,636,426 A | 1/1987 | Fleischer |
| 4,642,261 A | 2/1987 | Fearnhead |
| 4,676,278 A | 6/1987 | Dutt |
| 4,705,601 A | 11/1987 | Chiu |
| 4,709,732 A | 12/1987 | Kinnunen |
| 4,729,412 A | 3/1988 | Bugge |
| 4,731,281 A | 3/1988 | Fleischer et al. |
| 4,739,803 A | 4/1988 | Borel |
| 4,755,420 A | 7/1988 | Baker et al. |
| 4,759,975 A | 7/1988 | Sutherland et al. |
| 4,815,499 A | 3/1989 | Johnson |
| 4,815,503 A | 3/1989 | Borel |
| 4,909,284 A | 3/1990 | Kositzke |
| RE33,195 E | 4/1990 | McDonald et al. |
| 4,934,414 A | 6/1990 | Borel |
| 4,941,514 A | 7/1990 | Taipale |
| 4,942,077 A | 7/1990 | Wendt et al. |
| 4,945,952 A | 8/1990 | Vöhringer |
| 4,967,805 A | 11/1990 | Chiu et al. |
| 4,987,929 A | 1/1991 | Wilson |
| 4,989,647 A | 2/1991 | Marchand |
| 4,989,648 A | 2/1991 | Tate et al. |
| 4,998,568 A | 3/1991 | Vohringer |
| 4,998,569 A | 3/1991 | Tate |
| 5,022,441 A | 6/1991 | Tate et al. |
| 5,025,839 A | 6/1991 | Wright |
| 5,067,526 A | 11/1991 | Herring |
| 5,074,339 A | 12/1991 | Vohringer |
| 5,084,326 A | 1/1992 | Vohringer |
| 5,092,372 A | 3/1992 | Fitzka et al. |
| 5,101,866 A | 4/1992 | Quigley |
| 5,116,478 A | 5/1992 | Tate et al. |
| 5,152,326 A | 10/1992 | Vohringer |
| 5,158,118 A | 10/1992 | Tate et al. |
| 5,219,004 A | 6/1993 | Chiu |
| 5,228,482 A | 7/1993 | Fleischer |
| 5,277,967 A | 1/1994 | Zehle et al. |
| 5,358,014 A | 10/1994 | Kovar |
| 5,408,377 A | 4/1995 | Gurney et al. |
| 5,421,374 A | 6/1995 | Wright |
| 5,421,375 A | 6/1995 | Praetzel |
| 5,429,686 A | 7/1995 | Chiu et al. |
| 5,437,315 A | 8/1995 | Ward |
| 5,449,026 A | 9/1995 | Lee |
| 5,454,405 A | 10/1995 | Hawes |
| 5,456,293 A | 10/1995 | Ostermayer et al. |
| 5,465,764 A | 11/1995 | Eschmann et al. |
| 5,482,567 A | 1/1996 | Barreto |
| 5,487,414 A | 1/1996 | Kuji et al. |
| 5,518,042 A | 5/1996 | Wilson |
| 5,520,225 A | 5/1996 | Quigley et al. |
| 5,542,455 A | 8/1996 | Ostermayer et al. |
| 5,555,917 A | 9/1996 | Quigley |
| 5,564,475 A | 10/1996 | Wright |
| 5,641,001 A | 6/1997 | Wilson |
| 5,651,394 A | 7/1997 | Marchand |
| 5,709,250 A | 1/1998 | Ward et al. |
| RE35,777 E | 4/1998 | Givin |
| 5,746,257 A | 5/1998 | Fry |
| 5,751,521 A | 5/1998 | Gill |
| 5,826,627 A | 10/1998 | Seabrook et al. |
| 5,857,498 A | 1/1999 | Barreto et al. |
| 5,881,764 A | 3/1999 | Ward |
| 5,894,867 A | 4/1999 | Ward et al. |
| 5,896,252 A | 4/1999 | Kanai |
| 5,899,240 A | 5/1999 | Wilson |
| 5,937,914 A | 8/1999 | Wilson |
| 5,967,195 A | 10/1999 | Ward |
| 5,983,953 A | 11/1999 | Wilson |
| 6,073,661 A | 6/2000 | Wilson |
| 6,112,774 A | 9/2000 | Wilson |
| 6,123,116 A | 9/2000 | Ward et al. |
| 6,145,550 A | 11/2000 | Ward |
| 6,148,869 A | 11/2000 | Quigley |
| 6,158,478 A | 12/2000 | Lee et al. |
| 6,179,965 B1 | 1/2001 | Cunnane et al. |
| 6,202,705 B1 | 3/2001 | Johnson et al. |
| 6,207,598 B1 | 3/2001 | Lee et al. |
| 6,227,255 B1 | 5/2001 | Osterberg et al. |
| 6,237,644 B1 | 5/2001 | Hay et al. |
| 6,240,973 B1 | 6/2001 | Stone et al. |
| 6,244,306 B1 | 6/2001 | Troughton |
| 6,253,796 B1 | 7/2001 | Wilson et al. |
| 6,276,402 B1 | 8/2001 | Herring |
| 6,379,506 B1 | 4/2002 | Wilson et al. |
| 6,581,645 B1 | 6/2003 | Johnson et al. |
| 6,585,006 B1 | 7/2003 | Wilson et al. |
| 6,837,277 B2 | 1/2005 | Troughton et al. |
| 7,001,489 B2 | 2/2006 | Taipale et al. |
| 2002/0191348 A1* | 12/2002 | Hasegawa et al. ............ 360/314 |
| 2003/0010393 A1 | 1/2003 | Kuji |
| 2004/0079434 A1 | 4/2004 | Martin et al. |
| 2004/0102118 A1 | 5/2004 | Hay et al. |
| 2005/0002131 A1* | 1/2005 | Gill ....................... 360/324.12 |
| 2005/0041342 A1 | 2/2005 | Huai et al. |
| 2005/0088786 A1 | 4/2005 | Gill |
| 2005/0243477 A1 | 11/2005 | Gill |
| 2006/0067016 A1 | 3/2006 | Childress et al. |

FOREIGN PATENT DOCUMENTS

| | | |
|---|---|---|
| DE | 33 29 740 A1 | 3/1985 |
| EP | 0 048 962 B2 | 9/1981 |
| EP | 0 158 710 A1 | 10/1984 |
| EP | 0 185 177 B1 | 10/1985 |
| EP | 0 224 276 B1 | 12/1986 |
| EP | 0 264 881 B1 | 10/1987 |
| EP | 0 269 070 B1 | 11/1987 |
| EP | 0 284 575 B1 | 2/1988 |
| EP | 0 283 181 B1 | 3/1988 |
| EP | 0 350 673 B1 | 6/1989 |
| EP | 0 408 849 A2 | 5/1990 |
| EP | 0 408 849 A3 | 5/1990 |
| EP | 0 672 782 B1 | 3/1995 |
| EP | 0 794 283 A1 | 9/1997 |
| FR | 2 597 123 | 4/1986 |
| GB | 2157328 A | 10/1985 |
| GB | 2245006 A | 2/1991 |
| JP | 8-158285 | 12/1994 |
| WO | WO 86/00099 A1 | 1/1986 |
| WO | WO 89/09848 A1 | 4/1989 |
| WO | WO 99/61698 A1 | 12/1999 |
| WO | WO 02/00096 A2 | 1/2002 |
| WO | WO 03/010304 A2 | 2/2003 |

WO WO 03/093573 A1 11/2003

OTHER PUBLICATIONS

Zhu et al., "Spin transfer induced noise in CPP read heads," IEEE Transactions on Magnetics, vol. 40, No. 1, Jan. 2004, pp. 182-188.
Tanaka et al., "Spin-valve heads in the current-perpendicular-to-plane mode for ultrahigh-density recording", IEEE Transactions on Magnetics, 38 (1): 84-88 Part 1 Jan. 2002.
Zhu et al., "Current Induced Noise in CPP Spin Valves", IEEE Transactions on Magnetics, vol. 40, No. 4, Jul. 2004, pp. 2323-2325.
Reilly et al., "Perpendicular giant magnetoresistance of Co91Fe9/Cu exchange-biased spin valves; further evidence for a unified picture", J. Mag. Mag. Mat. 195, L269-L274 (1999).
Smith et al., "Angular Dependence of Spin Torque Critical Currents for CPP-GMR Read Heads", IEEE Transactions on Magnetics, vol. 41, No. 10, Oct. 2005, pp. 2935-2940.
European Search Report (Aug. 21, 2007).
International Search Report for PCT/US2004/008311.
International Search Report for PCT Application No. PCT/US97/18629.
Rule 132 Declaration of Robert G. Wilson (Jun. 26, 1997).
Warren, C.A., "The Importance of Yarn Properties in Wet-End Wire Construction," Seminar, The Theory of Water Removal, Dec. 12, 1979.
European Search Report corresponding to application No. EP 05002306.8, dated Oct. 18, 2005.

* cited by examiner

CURRENT-PERPENDICULAR-TO-THE-PLANE (CPP) MAGNETORESISTIVE SENSOR WITH ANTIPARALLEL-FREE LAYER STRUCTURE AND LOW CURRENT-INDUCED NOISE

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to a CPP sensor with low current-induced noise.

2. Background of the Invention

One type of conventional magnetoresistive sensor used as the read head in magnetic recording disk drives is a "spin-valve" (SV) sensor. A SV magnetoresistive sensor has a stack of layers that includes two ferromagnetic layers separated by a nonmagnetic electrically conductive spacer layer, which is typically copper (Cu). One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance.

In a magnetic recording disk drive SV read sensor or head, the stack of layers are located in the read "gap" between magnetic shields. The magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the SV is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor.

CPP-SV read heads are described by A. Tanaka et al., "Spin-valve heads in the current-perpendicular-to-plane mode for ultrahigh-density recording", *IEEE TRANSACTIONS ON MAGNETICS*, 38 (1): 84-88 Part 1 JAN 2002. Another type of CPP sensor is a magnetic tunnel junction (MTJ) sensor in which the nonmagnetic spacer layer is a very thin nonmagnetic tunnel barrier layer. In a MTJ magnetoresistive read head the spacer layer is electrically insulating and is typically alumina ($Al_2O_3$); in a CPP-SV magnetoresistive read head the spacer layer is electrically conductive and is typically copper.

CPP sensors are susceptible to current-induced noise and instability. The spin-polarized current flows perpendicularly through the ferromagnetic layers and produces a spin transfer torque on the local magnetization. This can produce continuous gyrations of the magnetization, resulting in substantial low-frequency magnetic noise if the sense current is above a certain level. This effect is described by J.-G. Zhu et al., "Spin transfer induced noise in CPP read heads," *IEEE TRANSACTIONS ON MAGNETICS*, Vol. 40, pp. 182-188, JAN 2004. In a related paper it was suggested, but not demonstrated, that the sensitivity to spin-torque-induced instability of the free layer could be reduced by use of a dual spin-valve. (J.-G. Zhu et al., "Current induced noise in CPP spin valves," *IEEE TRANSACTIONS ON MAGNETICS*, Vol. 40, No. 4, pp. 2323-2325, JUL 2004). However, a dual spin-valve requires a second spacer layer on the free layer and a second pinned layer on the second spacer layer, and thus results in a larger shield-to-shield read gap distance, which lowers sensor resolution.

What is needed is a CPP sensor that produces minimal current-induced noise without loss of magnetoresistance or sensor resolution.

SUMMARY OF THE INVENTION

The invention is a CPP magnetoresistive sensor with an antiparallel free (APF) structure and a specific direction for the applied bias or sense current that result in both increased magnetoresistance and, more importantly, reduced susceptibility to current-induced instability and noise. The (APF) structure has a first free ferromagnetic (FL1), a second free ferromagnetic layer (FL2), and an antiparallel (AP) coupling (APC) layer that couples FL1 and FL2 together antiferromagnetically with the result that FL1 and FL2 have substantially antiparallel magnetization directions. The antiferromagnetically-coupled FL1 and FL2 rotate together in the presence of a magnetic field, such as the magnetic fields from data recorded in a magnetic recording medium. The thicknesses of FL1 and FL2 are chosen to obtain the desired net free layer magnetic moment/area for the sensor, which for advanced CPP read heads is no greater than the equivalent moment/area of approximately 100 Å of NiFe. The sensor is based on the discovery that for a CPP sensor with an appropriate APF structure, the critical current above which current-induced noise occurs is substantially higher when the applied sense current is directed from the pinned layer to the APF structure. Thus the sensor operates with the sense current $I_S$ (which is the conventional current and opposite in direction to the electron current $I_e$) directed from the reference ferromagnetic layer to the APF structure, so that the spin-torque effect, and thus current-induced noise, is suppressed. This allows much higher sense currents to be used, resulting in higher sensor output voltage. Also, to maximize the sensor signal, the thickness of FL1 can be chosen to be greater than the spin-diffusion length of electrons in the FL1 material, which maximizes the bulk spin-dependent scattering in FL1.

For a fuller understanding of the nature and advantages of the present invention, reference should be made to the following detailed description taken together with the accompanying figures.

DETAILED DESCRIPTION OF THE INVENTION

Figure 1:
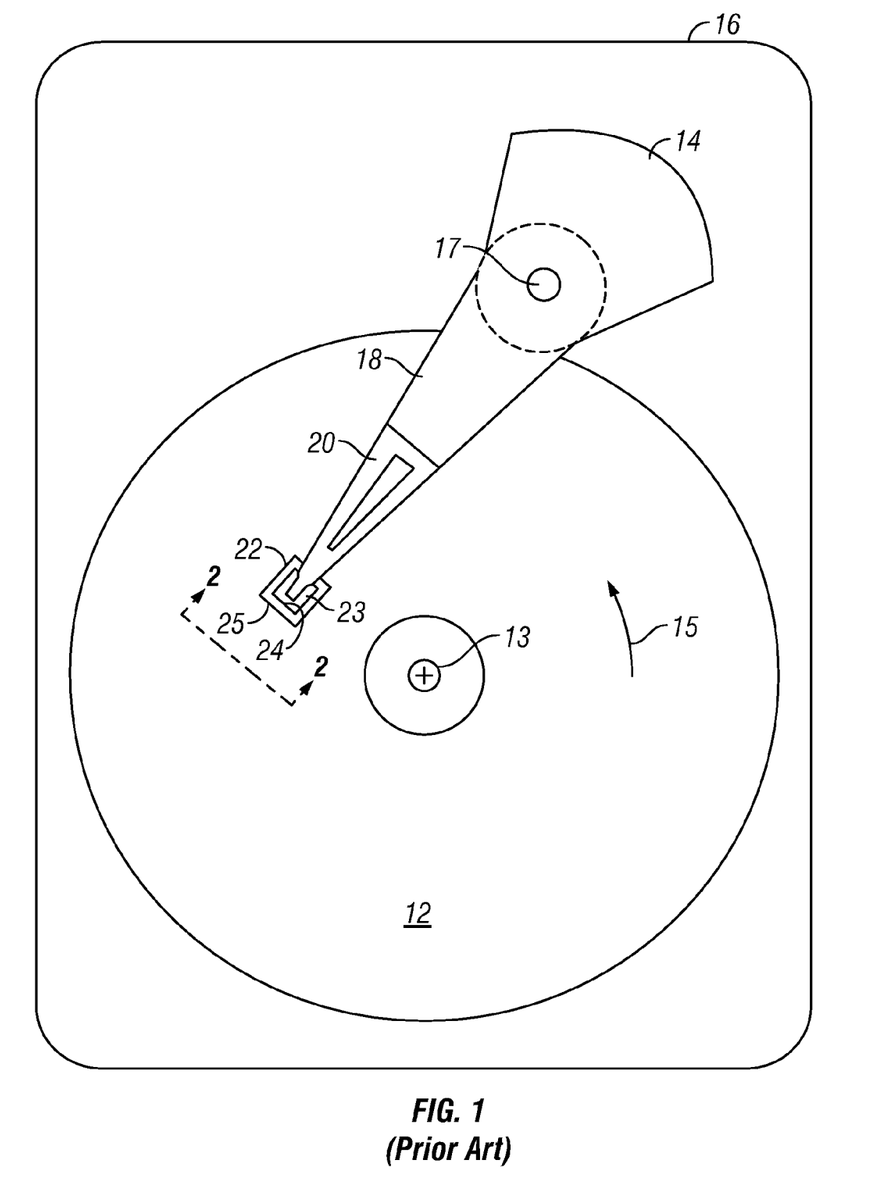
FIG. 1 is a schematic top view of a conventional magnetic recording hard disk drive with the cover removed.

The CPP-SV read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
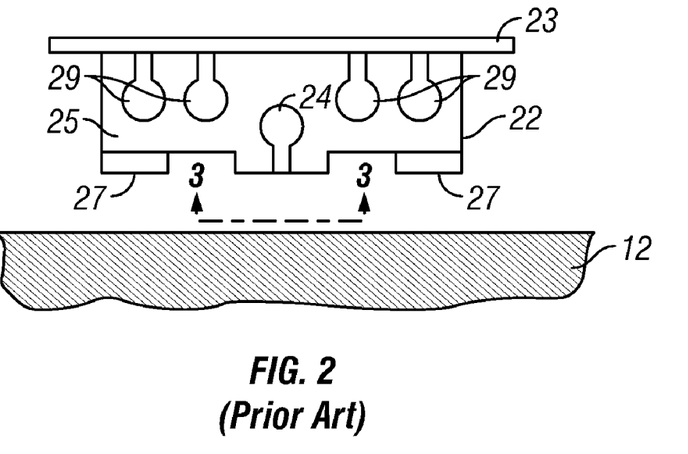
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 22 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
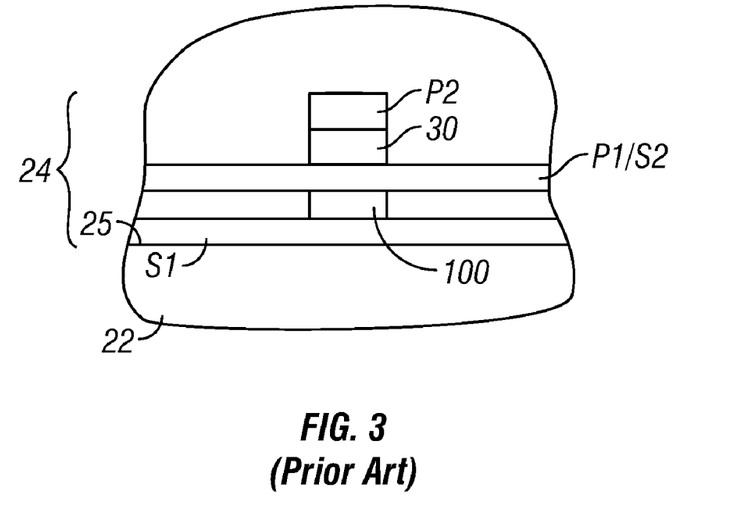
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P1 separated by a write gap 30. The CPP-SV magnetoresistive sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
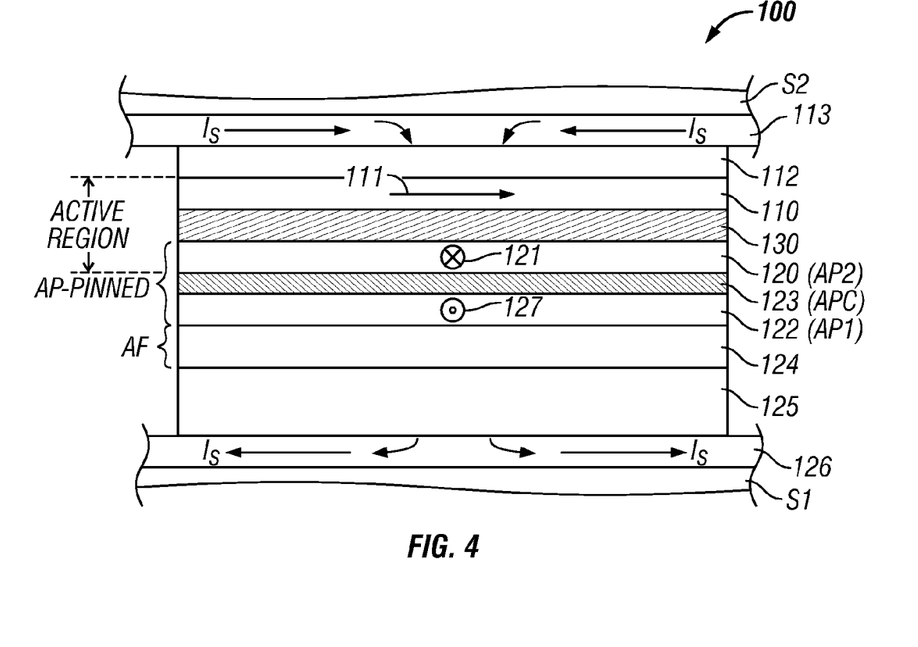
FIG. 4 is a cross-sectional schematic view of a CPP-SV read head showing the stack of layers located between the magnetic shield layers.

FIG. 4 is an enlarged sectional view showing the layers making up sensor 100 as seen from the air bearing surface (ABS) of the sensor. Sensor 100 is a CPP-SV read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a pinned ferromagnetic layer 120 having a fixed magnetic moment or magnetization direction 121 oriented substantially perpendicular to the ABS (into the page), a free ferromagnetic layer 110 having a magnetic moment or magnetization direction 111 that is oriented substantially parallel to the ABS and that can rotate in the plane of layer 110 in response to transverse external magnetic fields from the disk 12, and an electrically conducting spacer layer 130, typically copper (Cu), between the pinned layer 120 and the free layer 110.

The pinned ferromagnetic layer in a CPP-SV sensor may be a single pinned layer or an antiparallel (AP) pinned structure. An AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's electrically conducting spacer layer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. The AP-pinned structure minimizes the net magnetostatic coupling between the reference/pinned layers and the CPP-SV free ferromagnetic layer. The AP-pinned structure, also called a "laminated" pinned layer, and sometimes called a synthetic antiferromagnet (SAF), is described in U.S. Pat. No. 5,465,185.

The pinned layer in the CPP-SV sensor in FIG. 4 is an AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The free ferromagnetic layer 110, spacer layer 130 and AP2 layer 120 together make up what is call the "active region" of the sensor. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. Alternatively, the AP-pinned structure may be "self-pinned" or it may be pinned by a hard magnetic layer such as $Co_{100-x}Pt_x$ or $Co_{100-x-y}Pt_xCr_y$ (where x is about between 8 and 30 atomic percent). In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magneto-static coupling to the free layer is minimized and the effective pinning field of the AF layer 124, which is approximately inversely proportional to the net magnetization of the AP-pinned structure, remains high. In the case of a hard magnet pinning layer, the hard magnet pinning layer moment needs to be accounted for when balancing the moments of AP1 and AP2 to minimize magneto-static coupling to the free layer.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as a Cu/Ru/Ta trilayer.

In the presence of an external magnetic field in the range of interest, i.e., magnetic fields from recorded data on the disk 12, the magnetization direction 111 of free layer 110 will rotate while the magnetization direction 121 of reference layer 120 will remain substantially fixed and not rotate. The rotation of the free-layer magnetization 111 relative to the reference-layer magnetization 121 results in a change in electrical resistance. Hence, when a sense current $I_S$ is applied between top lead 113 and bottom lead 126, the resistance change is detected as a voltage signal proportional to the strength of the magnetic signal fields from the recorded data on the disk.

The leads 126, 113 are typically Ta or Rh. However, any low resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, IrMnCr, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 (AP1), 120 (AP2), and 110 (free layer) are typically formed of crystalline CoFe or NiFe alloys, or a multilayer of these materials, such as a CoFe/NiFe bilayer. These alloys have a sufficiently high magnetic moment M and bulk electron scattering parameter β, but a relatively low electrical resistivity ρ. The AP2 layer can also be a laminated structure to obtain a high degree of spin-dependent interface scattering. For example the AP2 layer can be a FM/XX/FM/ . . . /XX/FM laminate, where the ferromagnetic (FM) layers are formed of Co, Fe or Ni, one of their alloys, or a multilayer of these materials, such as a CoFe—NiFe—CoFe trilayer; and the XX layers are nonmagnetic layers, typically Cu, Ag, or Au or their alloys, and are thin enough that the adjacent FM layers are strongly ferromagnetically coupled.

For example, AP2 layer 120 may be a CoFe alloy, typically 10 to 30 Å thick, and the free ferromagnetic layer 110 may be a bilayer of a CoFe alloy, typically 10-15 Å thick and formed on the spacer layer 130, with a NiFe alloy, typically 10-30 Å thick, formed on the CoFe layer of the bilayer. The APC layer in the AP-pinned structure is typically Ru or Ir with a thickness between about 4-10 Å.

If the AP-pinned structure is the "self-pinned" type, then no antiferromagnetic pinning layer is required. In a self-pinned structure where no antiferromagnet or hard magnet pinning layer is present, the AP1 layer is in contact with a seed layer on the sensor substrate.

A hard magnetic bias layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer (NOL) to locally confine the current path and increase the effective resistance of the active region. A CoFe NOL may be formed, for example, by interrupting the deposition after some CoFe has been deposited somewhere in the free layer, the AP2 layer, the capping layer, or the conductive spacer layer and oxidizing its surface for several minutes in an $O_2$ or $O_2$/Ar gas at 0.1-10 Torr. NOLs can be formed by oxidizing other materials, e.g., Cu/Al or Cu/Ti alloys or multilayers.

While the read head 100 shown in FIG. 4 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the spacer layer 130.

In this invention the CPP sensor is similar to the CPP sensor described above, but has an antiparallel-free (APF) structure as the free layer, and a specific direction for the applied bias or sense current, that result in both increased magnetoresistance and reduced susceptibility to current-induced instability and noise. While the invention will be described with respect to a CPP-SV read head, the invention is applicable to other types of CPP magnetoresistive sensors such as MTJ sensors, and to CPP sensors with NOLs.

Figure 5:
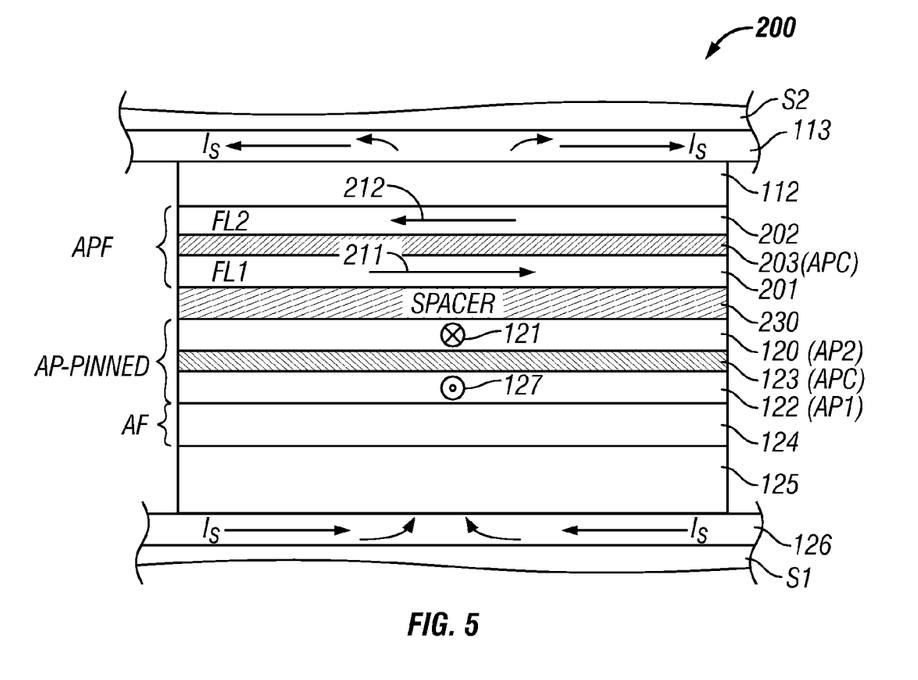
FIG. 5 is a cross-sectional schematic view of a CPP-SV read head according to this invention.

The CPP-SV sensor of this invention is illustrated in FIG. 5 as sensor 200. The free layer is an antiparallel free (APF) structure comprising a first free ferromagnetic layer 201 (FL1), second free ferromagnetic layer 202 (FL2), and an antiparallel (AP) coupling (APC) layer 203. APC layer 203, such as a thin (between about 4 Å and 10 Å) Ru film, couples FL1 and FL2 together antiferromagnetically with the result that FL1 and FL2 maintain substantially antiparallel magnetization directions, as shown by arrows 211, 212, respectively. The antiferromagnetically-coupled FL1 and FL2 rotate together in the presence of a magnetic field, such as the magnetic fields from data recorded in a magnetic recording medium. The net magnetic moment/area of the APF structure (represented by the difference in magnitudes of arrows 211, 212) is (M1*t1−M2*t2), where M1 and t1 are the saturation magnetization and thickness, respectively, of FL1, and M2 and t2 are the saturation magnetization and thickness, respectively, of FL2. Thus the thicknesses of FL1 and FL2 are chosen to obtain the desired net free layer magnetic moment for the sensor. In advanced CPP read heads, it is desirable that the net magnetic moment/area of the free layer (M1*t1−M2*t2), be no greater than the equivalent moment/area of approximately 100 Å of NiFe.

An APF structure as a free layer in a CIP sensor was first described in U.S. Pat. No. 5,408,377. A specific type of Fe-based APF structure as a free layer in a CPP sensor is described in US 2005/0243477 A1, assigned to the same as assignee as this application. In the sensor described in that application the objective is high magnetoresistance, so the free layer material near the spacer layer is Fe and the spacer layer is thus required to be Cr because Fe/Cr multilayers are a well-known system exhibiting giant magnetoresistance. The use of pure Fe in the free layer near the spacer layer requires that a second free layer farther from the spacer layer be used to lower the coercivity of the Fe-based APF and that the second free layer be alloyed with nitrogen (N) to further reduce the coercivity. However, it is not preferred to use pure elements such as Fe in the free layer or any other active magnetic layer of a CPP sensor. Rather, it is preferred to use an alloy, such as a FeCo alloy, to increase electron scattering and thus to shorten the spin-diffusion length. This is important to achieve high magnetoresistance with thin magnetic layers, resulting in a thin sensor capable of high resolution. Also, pure Fe is corrosive and should be avoided for reliability reasons.

In this invention the spacer layer 230 is not formed of Cr, but is preferably Cu, Au or Ag which yield higher CPP magnetoresistance in contact with $Co_xFe_{1-x}$ (50<x<100 at. %) and $Ni_xFe_{1-x}$ (50<x<100 at. %) magnetic layers. Also, in this invention FL1 and FL2 are not formed of Fe or FeN due to their susceptibility to corrosion at the air-bearing surface, but may be formed of crystalline CoFe or NiFe alloy, or a multilayer of these materials, such as a CoFe/NiFe bilayer. FL1 and FL2 may also be formed of relatively high-resistance amorphous alloys, such as an alloy of one or more elements selected from Co, Fe and Ni, and at least one nonmagnetic element that is present in an amount that renders the otherwise crystalline alloy amorphous. Examples of amorphous alloys for FL1 and FL2 include $Co_{(100-x-y)}Fe_xX_y$ and $Ni_{(100-x-y)}Fe_xX_y$ where X is B, Si or Tb, and y is between about 5 and 40 atomic percent (at. %). FL1 and FL2 may also be formed of a ferromagnetic Heusler alloy, i.e., a metallic compound having a Heusler alloy crystal structure. Examples of Heusler alloys for FL1 and FL2 include $Co_2MnX$ (where X is Al, Sb, Si or Ge), NiMnSb, PtMnSb, and $CO_2Fe_xCr_{(1-x)}Al$ (where x is between 0 and 1). FL1 and FL2 may also be formed of a high-resistance ferromagnetic crystalline alloy based on CoFe or NiFe alloys, with short spin diffusion length (<100 Å) and resulting in appreciable CPP magnetoresistance, and containing one or more additions of Cu, Mg, Al, Si, Au, Ag or B. Also, in this invention the APC layer 203 is not formed of Cr, but is preferably Ru, Ir, or Rh or alloys thereof.

In this invention, it can be advantageous to select the composition and thickness of FL1 to be greater than the spin-diffusion length of the electrons in the FL1 material to maximize the bulk spin-dependent scattering of electrons and thus maximize the sensor signal. If the FL1 thickness is significantly less than the spin-diffusion length, (which is about 40 Å for NiFe), then the signal due to FL1 is not maximized. In addition, FL2 may participate in the spin-valve effect and may, due to its magnetization being opposite in direction to that of FL1, cause a negative contribution to the magnetoresistance. If FL1 is sufficiently thick (substantially above the spin-diffusion length or at least about 110% of the spin-diffusion length), then the signal from FL1 is close to maximum, and there is no appreciable negative spin-valve contribution from FL2. The spin-diffusion length depends on the magnetic material and is about 40 Å for NiFe, 500 Å for Co, and 120 Å for $Co_{90}Fe_{10}$. If materials that have a high spin-diffusion length are used for FL1 then the APF structure can be made thicker if an optimum signal amplitude is desired, but that will increase the overall shield-to-shield spacing of the sensor. The spin-diffusion length in any material may be determined through a series of experiments measuring the dependence of the CPP spin-valve effect on the thickness of the material of interest. The material of interest may be included either in the spacer layer or be substituted for one of the ferromagnetic layers. See for example A. C. Reilly et al., *J. Mag. Mag. Mat.* 195, L269-L274 (1999). These experiments are somewhat difficult and tedious, so the spin-diffusion length is not yet known for a large number of materials. One general trend is that the spin-diffusion length varies inversely with the electrical resistivity, i.e., materials with a large electrical resistivity display a short spin-diffusion length. In general, alloys exhibit higher resistivity than pure metals, i.e, unalloyed elemental metals, and thus shorter spin-diffusion lengths. Thus, in general, alloys tend to have shorter spin diffusion lengths than pure metals because they exhibit a larger resistivity than the elements they are comprised of due to enhanced electron scattering.

In this invention, as shown in FIG. 5, the direction of the sense current $I_S$ (which is the conventional current and opposite in direction to the electron current) is specifically chosen to be from the AP-pinned structure to the APF structure (from bottom lead 126 to top lead 113), so that the spin-torque effect, and thus current-induced noise, is suppressed, as will be explained below. Also, while the thicknesses of FL1 and FL2 are chosen to obtain the desired net free layer magnetic moment/area for the sensor, in this invention the thickness of FL2 is also chosen to be above a certain threshold value. From experimental data described below the thickness of FL2 should be greater than a threshold value, about 25% of the thickness of FL1 or 15 Å for NiFe.

CPP test samples with APF structures of this invention (similar to FIG. 5) were compared with a CPP control sample with a single free layer (similar to FIG. 4). The material for the free layers was a NiFe alloy with 2 at. % Tb ($Ni_{83}Fe_{15}Tb_2$), where the subscripts represent atomic percent. The control had a free layer thickness of 40 Å, a $\Delta RA$ of about 0.75 $mOhm-\mu m^2$, and a $\Delta R/R$ of about 2.35%. In the CPP test sample if the APF structure had FL1=50 Å and FL2=10 Å there was no significant difference in $\Delta RA$ from the control. This is likely because the positive effect of the thicker FL1 (50 Å compared to the 40 Å control) is compensated by the negative effect of the FL2 layer. However, if FL2 is thicker (FL2=20 Å and FL1=60 Å; or FL2=30 Å and FL1=70 Å), then the $\Delta RA$ signal is higher than the control (0.87 $mOhm-\mu m^2$ and 0.90 $mOhm-\mu m^2$ for FL1=60 Å and 70 Å, respectively). Although FL2 increased in thickness, it did not result in any noticeable decrease in $\Delta RA$ because FL1 is substantially greater than the spin-diffusion length in NiFe or NiFeTb (which is at most about 40-50 Å), and the Ru APC layer (layer 203 in FIG. 5) further mixes the electron spins, so that FL2 becomes "disconnected" from the FL1 reference layer (layer 120 in FIG. 5) and cannot significantly participate in the spin-valve effect. For the test sample with FL1=50 Å and FL2=10 Å the $\Delta R/R$ decreased from the control value of 2.35% to 2.15%, but for the test sample with FL1=60 Å and FL2=20 Å the $\Delta R/R$ then increased to about 2.5%. As FL1 is made even thicker (keeping the FL2-FL1 thickness difference at about 40 Å) it is expected from the considerations above that $\Delta RA$ would saturate to a nearly constant value, while $\Delta R/R$ would also saturate but eventually decrease as RA increases with additional layer thickness. Thus CPP sensors with thicker FL1 layers (FL1=60 Å or FL1=70 Å) are optimized for a magnetoresistive response.

In another set of test samples, the APF layer structure comprised a trilayer FL1=CoFe(6 Å)/NiFe(t1)/CoFe(2 Å) and a bilayer FL2=CoFe(2 Å)/NiFe(t2), and the thicknesses t1 and t2 were chosen so that the net moment/area (M1*t1−M2*t2) of the APF structure was constant at the equivalent moment/area of about 45 Å of NiFe. The control sample with a simple free layer (no FL2, and FL1=6 Å CoFe/38 Å NiFe/2 Å CoFe) had a $\Delta R/R$ of about 2.13%. For the test samples with an APF structure and t2 values from 5 Å to 45 Å (t1 values from 45 Å to 85 Å) the $\Delta R/R$ increased to about 2.7% to 2.8%. The $\Delta RA$ increased from 0.68 $mOhm-\mu m^2$ for the sample with the simple free layer structure to 0.93 $mOhm-\mu m^2$ for the sample with the APF structure with t2=15 Å of NiFe.

An important feature of this invention, in addition to an improved magnetoresistance, is that the CPP sensor exhibits substantial immunity to current-induced noise when the bias or sense current $I_S$ is in the direction from the pinned layer to the APF structure (from lead 126 to lead 113 in FIG. 5). For the purpose of FIGS. 6-7, this actual sense current direction corresponds to "negative" electron current $I_e$ (i.e., the electrons flow from the APF structure to the pinned layer).

Figure 6:
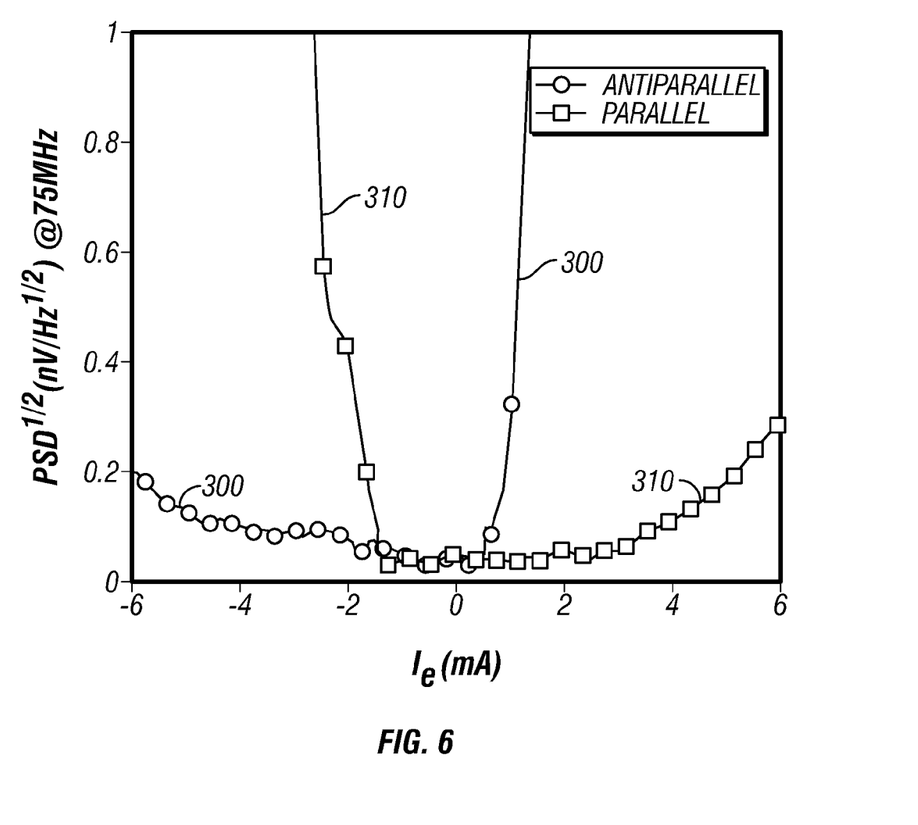
FIG. 6 is a graph of noise power spectral density (PSD) as a function of electron current $I_e$ at positive and negative applied magnetic fields for a control sample according to the prior art with a single free layer, wherein positive electron current $I_e$ corresponds to electron flow from the pinned layers towards the free layers.
Figure 7:
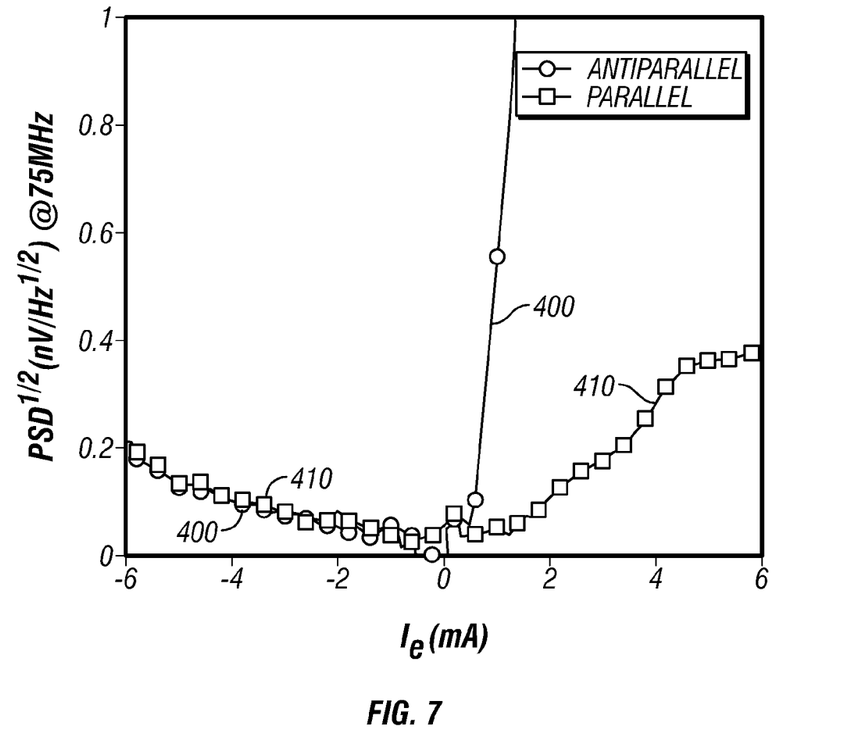
FIG. 7 is a graph of noise power spectral density (PSD) as a function of electron current $I_e$ at positive and negative applied magnetic fields for a sample according to this invention with an antiparallel-free structure, wherein positive electron current $I_e$ corresponds to electron flow from the pinned layers towards the free layers.

FIG. 6 shows the noise power spectral density (PSD) for a control sample with a single free layer (FL2=none; t1=38 Å NiFe). Positive applied magnetic fields (curve 300) correspond to the pinned and free layer net magnetizations being antiparallel, and negative applied fields (curve 310) correspond to the pinned and free layer net magnetizations being parallel. It can be seen that for a "positive" electron current $I_e$ (actual sense current $I_S$ from the free layer to the pinned layer or from top to bottom in FIG. 4) the antiparallel curve 300 shows a large increase in noise power above a "critical current" of about 0.6 mA, while for negative electron currents the noise increase for the parallel orientation (curve 310) is above critical current of about 1.5 mA. This behavior is expected in the present understanding of current-induced noise in spin-valve structures. By comparison with FIG. 6, FIG. 7 shows the PSD for a sample with an APF structure like this invention, with t1=65 Å NiFe and t2=25 Å NiFe. Positive applied magnetic fields (curve 400) correspond to the pinned and free layer net magnetizations being antiparallel, and negative applied fields (curve 410) correspond to the pinned and free layer net magnetizations being parallel.

A comparison of FIGS. 6 and 7 shows that while the behavior for positive electron currents is qualitatively similar (i.e., a large increase in noise power above a critical current of about 0.6 mA), the behavior for negative electron currents is unexpected and unique. In particular, in FIG. 7 the noise power remains extremely low for both parallel and antiparallel orientations, up to large values of the electron current ("more negative" than a critical current of about 6.5 mA, although the exact value is not known due to limitations in the measurement method).

Figure 8:
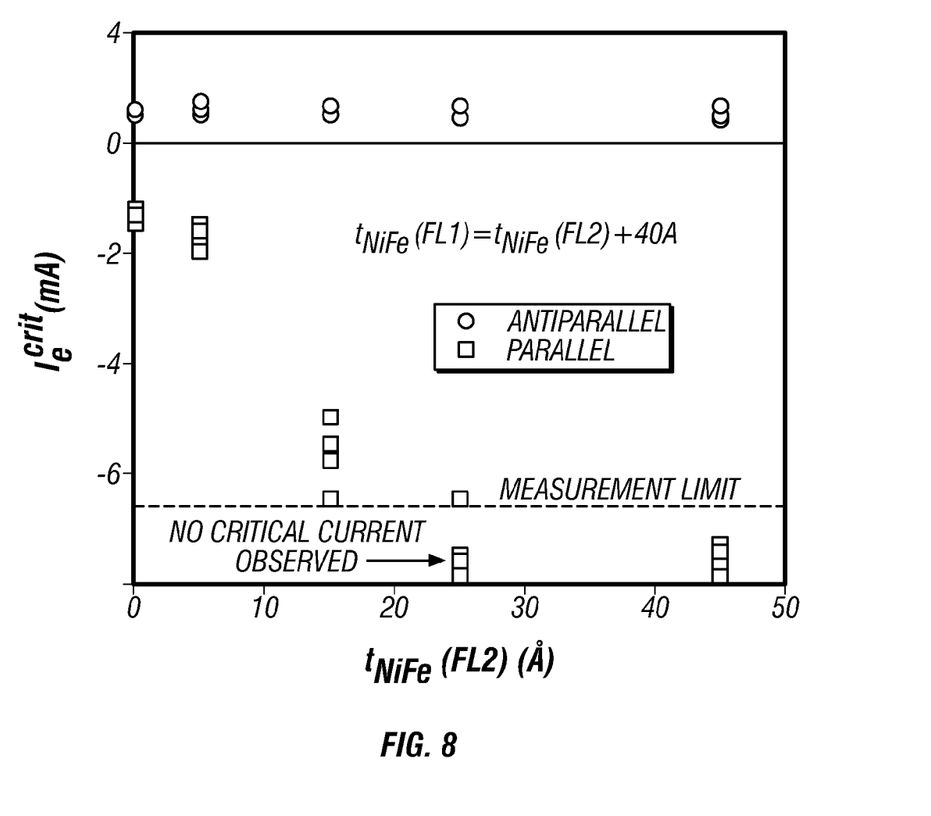
FIG. 8 is a graph of positive and negative critical electron currents $I_e^{crit}$ for spin-torque-induced noise as a function of the FL2 thickness.

FIG. 8 is a graph of positive and negative critical electron currents for spin-torque-induced noise as a function of the FL2 thickness. (Negative electron current corresponds to electrons flowing from the APF structure to the pinned layer, which corresponds to bias or sense current from the pinned layer to the APF structure). The behavior illustrated in FIG. 7 is well optimized for the structure described here when FL2 is thicker than a minimum value of equivalent NiFe thickness. For example, as shown in FIG. 8, other samples with thinner FL2 (NiFe=5 Å and NiFe=15 Å) did not show this effect or showed a much smaller immunity to current-induced noise, while samples with thicker FL2 (NiFe=25 Å and above) did display this behavior. As shown by FIG. 8, sensors with $t_{NiFe}(FL2) \geq 15$ Å will exhibit high negative critical currents for spin-torque noise. Thus, there is a range of APF structures (with appropriate FL1 and FL2 equivalent NiFe thicknesses) which display this current-induced noise immunity for negative electron current (bias or sense current $I_S$ in the direction from the pinned layer to the APF structure), in addition to an improved magnetoresistive response.

Thus the CPP sensor according to this invention allows a much larger bias or sense current to be applied before current-induced noise occurs, provided the sense current $I_S$ is applied in the direction from the pinned layer to the APF structure (electron current $I_e$ from the APF structure to the pinned layer). The increase in critical current for current-induced noise by a factor of three or more can provide a corresponding increase in output voltage for the sensor.

In this invention the effect on sensor operation due to the increase in critical current (by a factor of three or more) is potentially much larger than the increase in output voltage due to the increase in magnetoresistance (by 10-30%) from the APF structure. Consequently, if the thinnest possible sensor (or a much smaller free layer magnetization) is desired, the increase in critical current, and corresponding increase in sensor output voltage, can still be realized using thinner FL1 and FL2 layers in the APF structure (and correspondingly smaller magnetoresistance), as long as FL2 is above a critical thickness as described above.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor having first and second electrical leads for connection to a current source that directs sense current from the first lead to the second lead, the sensor having a stack of layers between the first and second leads comprising:
   one and only one pinned ferromagnetic layer having an in-plane magnetization direction;
   an antiparallel free (APF) structure consisting of a first free ferromagnetic layer (FL1) having an in-plane magnetization direction, a second free ferromagnetic layer (FL2) having an in-plane magnetization direction substantially antiparallel to the magnetization direction of FL1 and a magnetic moment less than that of FL1, and an AP coupling (APC) layer between and in contact with FL1 and FL2 and consisting essentially of a material selected from the group consisting of Ru, Ir, Rh and alloys thereof; and
   an electrically conductive spacer layer between the pinned ferromagnetic layer and FL1 and consisting essentially of an element selected from the group consisting of Cu, Ag and Au, the pinned ferromagnetic layer being located between the spacer layer and the first lead; and
   wherein the sensor senses external magnetic fields in response to sense current applied perpendicular to the planes of the layers in the sensor stack in a direction from the first lead to the pinned ferromagnetic layer to the spacer layer to the APF structure and to the second lead.

2. The sensor of claim 1 wherein the sensor is a magnetoresistive read head for reading magnetically recorded data from tracks on a magnetic recording medium, and wherein the first and second electrical leads are shields formed of magnetically permeable material.

3. The sensor of claim 1 further comprising a substrate and wherein the first lead is a first lead layer on the substrate, the pinned ferromagnetic layer is on the first lead layer, the spacer layer is on the pinned ferromagnetic layer, FL1 is on the spacer layer, and the second lead is a second lead layer on the APF structure.

4. The sensor of claim 1 wherein FL1 comprises a crystalline alloy of Fe and at least one of Ni and Co.

5. The sensor of claim 1 wherein FL1 comprises an amorphous ferromagnetic alloy comprising a nonmagnetic element X and at least one of Co, Ni and Fe.

6. The sensor of claim 1 wherein FL1 comprises a ferromagnetic Heusler alloy.

7. The sensor of claim 1 wherein the net magnetic moment/area of the APF structure is less than the magnetic moment/area of 100 Å of NiFe.

8. The sensor of claim 1 wherein the thickness of FL1 is at least 110% of the spin diffusion length of the material from which FL1 is formed.

9. The sensor of claim 1 wherein FL1 is formed essentially of NiFe and the thickness of FL1 is at least 45 Å.

10. The sensor of claim 1 wherein FL1 and FL2 are formed of substantially the same material and wherein the thickness of FL2 is greater than about 25% of the thickness of FL1 and less than the thickness of FL1.

11. The sensor of claim 1 wherein the pinned ferromagnetic layer comprises an antiparallel (AP) pinned structure comprising a first AP-pinned (AP1) ferromagnetic layer having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers; and wherein the electrically conductive spacer layer is on the AP2 layer.

12. The sensor of claim 11 further comprising a hard magnetic layer in contact with the AP1 layer for pinning the magnetization direction of the AP1 layer.

13. The sensor of claim 11 wherein the AP-pinned structure is a self-pinned structure.

14. The sensor of claim 11 further comprising an antiferromagnetic layer exchange-coupled to the AP1 layer for pinning the magnetization direction of the AP1 layer.

15. A current-perpendicular-to-the-plane magnetoresistive read head for reading magnetically recorded data from tracks on a magnetic recording medium when a sense current is applied to the head in a direction from a first electrical lead to a second electrical lead, the head comprising:
   a substrate;
   a first electrical lead layer on the substrate;
   one and only one pinned ferromagnetic layer, said one and only one pinned ferromagnetic layer being located on the first electrical lead layer and having an in-plane magnetization direction;
   an electrically conductive spacer layer on the pinned ferromagnetic layer and consisting essentially of an element selected from the group consisting of Cu, Ag and Au;
   an antiparallel free (APF) structure consisting of (a) a first free ferromagnetic layer (FL1) on the spacer layer and having an inplane magnetization direction, (b) a second free ferromagnetic layer (FL2) having an in-plane magnetization direction substantially antiparallel to the magnetization direction of FL1 and a magnetic moment less than that of FL1, wherein each of FL1 and FL2 is formed of an alloy comprising Fe and one or both of Ni and Co and FL2 has a thickness greater than 25 percent of the thickness of FL1 and less than the thickness of FL1, and (c) an AP coupling (APC) layer between and in contact with FL1 and FL2 and consisting essentially of a material selected from the group consisting of Ru, Ir, Rh and alloys thereof;
   a second electrical lead layer on FL2; and
   a source of sense current connected to the first and second electrical lead layers and supplying current to the sensor in a direction from the first electrical lead layer through said one and only one pinned ferromagnetic layer, spacer layer, and APF structure to the second electrical lead layer.

16. The head of claim 15 wherein at least one of the FL1 and FL2 alloys is an amorphous ferromagnetic alloy comprising a nonmagnetic element.

17. The head of claim 15 where FL1 comprises an amorphous ferromagnetic alloy comprising a nonmagnetic element X and at least one of Co, Ni and Fe.

18. The head of claim 15 wherein the net magnetic moment/area of the APF structure is less than the magnetic moment/area of 100 Å of NiFe.

19. The head of claim 15 wherein the thickness of FL1 is at least 110% of the spin diffusion length of the material from which FL1 is formed.

20. The head of claim 15 wherein FL1 is formed essentially of NiFe and the thickness of FL1 is at least 45 Å.

21. The head of claim 15 wherein the pinned ferromagnetic layer comprises an antiparallel (AP) pinned structure comprising a first AP-pinned (AP1) ferromagnetic layer having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers; and wherein the electrically conductive spacer layer is on the AP2 layer.

* * * * *